United States Patent [19]

Gallagher et al.

[11] Patent Number: 4,962,086

[45] Date of Patent: Oct. 9, 1990

[54] HIGH $T_c$ SUPERCONDUCTOR - GALLATE CRYSTAL STRUCTURES

[75] Inventors: William J. Gallagher, Ardsley; Edward A. Giess, Purdys; Aranava Gupta, Valley Cottage; Robert B. Laibowitz; Eugene J. O'Sullivan, both of Peekskill; Robert L. Sandstrom, Chappaqua, all of N.Y.

[73] Assignee: International Business Machines Corporation, Armonk, N.Y.

[21] Appl. No.: 204,066

[22] Filed: Jun. 8, 1988

[51] Int. Cl.⁵ ............................................. B32B 9/00
[52] U.S. Cl. .................................... 505/1; 505/701; 505/702; 505/704; 29/599; 428/688; 428/930; 428/901
[58] Field of Search ............... 505/1, 701, 702, 704; 29/599; 428/688, 930, 209, 457, 901

[56] References Cited

FOREIGN PATENT DOCUMENTS 0171924  7/1987  Japan .

OTHER PUBLICATIONS

Wall Street Journal, Nov. 3, 1988, "Researchers Discover New Materials for Use in Superconducting Electronics".
Superconductor Week, Oct. 30, 1989, "High Quality Monocrystal Developed by Japanese".

Primary Examiner—Patrick Ryan
Attorney, Agent, or Firm—Jackson E. Stanland

[57] ABSTRACT

High $T_c$ oxide superconductive films can be formed on gallate layers, where the gallate layers include a rare earth element or a rare earth-like element. Combinations of rare earth elements and rare earth-like elements can also be utilized. The superconductive films can be epitaxially deposited on these gallate layers to form single crystals or, in the minimum, highly oriented superconductive layers. Any high $T_c$ superconductive oxide material can be utilized, but the best lattice matches are to superconductive materials including copper oxides. Examples include Y-Ba-Cu-O systems, Bi-based systems and Tl-based systems.

29 Claims, 2 Drawing Sheets

HIGH $T_c$ SUPERCONDUCTOR - GALLATE CRYSTAL STRUCTURES

BACKGROUND OF THE INVENTION

1. Field of the Invention

This invention relates to high $T_c$ superconductor films deposited on gallate substrates, and more particularly to such film-substrate combinations which are suitable for device structures at temperatures above 77° K.

2. Description of the Prior Art

The discovery of high temperature superconductivity in copper oxide based materials by Mueller and Bednorz in 1986 has been followed by many advances based on their discovery. Thus, the superconducting transition temperature has been raised to approximately 125° K. in a thallium-based copper oxide (S. S. A. Parkin et al., submitted to Phys. Rev. Lett., March 11, 1988). The initial discovery of a thallium-based superconductor by researchers at the University of Arkansas was announced at the World Congress on Superconductivity, held in Houston, Tex., Feb. 22-24, 1988. Just prior to this, researchers headed by H. Maeda at the National Research Institute for Metals, Tsukuba, Japan had announced a superconducting compound of bismuth, calcium, strontium, copper, and oxygen showing evidence of superconductivity at about 105° K. A few days after this, Paul Chu at the University of Houston announced a substantially identical compound except that it contained an additional element—aluminum.

Prior to the discovery of the bismuth-based copper oxide and the thallium-based copper oxide superconductors, most of the work in this technology had been centered on rare earth copper oxides and in particular on yttrium barium copper oxide superconductors having a transition temperature of about 95° K. These materials were typically known as 1-2-3 compounds because of the atomic ratio Y-Ba-Cu in the superconducting phase of these materials.

All of these copper oxide based superconductors contain sheets, or planes, of copper oxide which appear to be responsible for carrying the supercurrents. However, the bismuth and thallium-based compounds appear not to have the copper oxide chains which are present in the rare earth copper oxide superconductors and in the yttrium 1-2-3 compounds. One of the superconducting phases in the bismuth-based oxides appears to be 2-1-2-2 (2 bismuth atoms, 1 calcium atom, 2 strontium atoms and 2 copper atoms), while the thallium-based superconductor contains thallium, calcium, barium, copper and oxygen, the superconducting material possibly having a 2-1-2-2 as well as a 2-2-2-3 superconducting phase.

It is known in the art how to produce thin films of high $T_c$ superconducting material, and specifically epitaxial superconducting films. Such films have been made by several techniques including electron beam evaporation, sputtering, and solution pyrolysis. In particular, films of high temperature copper oxide superconductors have been produced on several substrates, including $SrTiO_3$, Si, Y-stabilized $ZrO_2$, MgO, $Al_2O_3$, and various aluminates. To date, the best films have been deposited on $SrTiO_3$, these films being produced epitaxially and with the highest critical current density. Articles generally describing thin film deposition of oxide superconductors include the following:

1. M. Nastasi et al., J. Mater. Res. 2 (6), p. 726, Nov/-Dec. 1987.
2. M. Naito et al., Ibid, p. 713
3. R. B. Laibowitz et al., Phys. Rev. B 35 8821 (1987)
4. P. Chaudhari et al., Phys. Rev. Lett., 58 2684 (1987)
5. A. Gupta et al., Appl. Phys. Lett., 52, 163 (1988).

Although many substrates have been tried for the preparation of high $T_c$ oxide superconducting films, the results to date have not been superior in all respects. For example, it has not been possible to deposit high quality epitaxial thin films which are superconductive in their as-deposited state. It has generally been the situation that the film was amorphous or fine grain polycrystalline as-deposited and crystallized in a high temperature post annealing step. This has been the method used to obtain the highest quality epitaxial, high current density films. Sometimes an annealing step is used to convert the film from tetragonal to orthorhombic. Since the lattice constants for these two crystalline structures are quite far apart, the required structural change has often produced superconducting films that contain crystalline twins, microcracks, and contamination. Thus, none of the presently known substrates has offered the possibility of direct deposition of a high quality, high current density, high $T_c$ superconducting film without the additional processing steps. This is especially true for the 1-2-3 films that are orthorhombic instead of having 4-fold planar symmetry such as the readily available substrates MgO, $SrTiO_3$ etc.

As mentioned, $SrTiO_3$ has so far produced the best superconducting copper oxide films. This substrate provides a reasonable lattice match to the superconductor films and can tolerate high temperature annealing steps. However, large quantities of Sr go into the superconducting film during high temperature processing steps, and for this reason the reactivity of this substrate is quite high. Further, and more importantly, $SrTiO_3$ has an extremely high dielectric constant which is variable from sample to sample in accordance with the substrate orientation and temperature, this material also being a very lossy dielectric. It is difficult to produce using preferred conventional crystal growth techniques such as Czochralski or Bridgman techniques and costly to produce by the Verneuil method. In addition to the fabrication costs, it is very difficult to obtain large area substrates of $SrTiO_3$.

Si is a useful material for semiconductors, but has a disadvantage in that it generally must be passivated by a thin layer prior to the formation of the high $T_c$ oxide superconductor. This is because the Si atoms tend to diffuse into the superconductor and adversely affect its high $T_c$ superconductivity.

MgO is a substrate material whose dielectric constant is very much less than that of $SrTiO_3$; however, it is not favorable for high temperature annealing steps due to interdiffusion of Mg, and can be difficult and expensive to prepare for the deposition of a superconducting film thereon. More importantly, its lattice constants do not match well with superconducting copper oxide films so that epitaxy is not favorable without other techniques such as graphoepitaxy.

Y-stabilized zirconia is chemically better than MgO at high temperatures, but inferior from a dielectric loss viewpoint. Additionally, the lattice match to the copper oxide superconducting films is not favorable.

Aluminates have also been used as substrate materials, but these substrates are very reactive, and the reactivity increases as the processing temperatures increase.

It has been discovered that Al will replace Cu detrimentally in the superconducting film to adversely affect the superconducting properties. Additionally, the spacing of atoms in the aluminates is too small to give good lattice matches to the superconducting film, regardless of the processing temperatures.

Thus, while thin films of high $T_c$ oxide superconductors have been made which in some instances have yielded very high critical currents, the presently known substrates all have disadvantages which may preclude the use of superconductive films in device structures. Accordingly, it is a primary object of the present invention to provide a class of materials which can be used as substrates and interface layers for the growth of films of high $T_c$ oxide superconductors having improved properties.

It is another object of the present invention to provide high $T_c$ copper oxide superconductor-substrate combinations wherein high quality, single crystal epitaxial superconductor films are produced.

It is another object of the present invention to provide high $T_c$ oxide superconductor film-substrate combinations suitable for use in electrical devices.

It is another object of this invention to provide high $T_c$ copper oxide superconductor film-substrate combinations which are particularly well suited for analog and digital signal processing devices.

It is a further object of this invention to provide a class of improved substrate materials for high $T_c$ oxide superconductors where the substrate material can advantageously be used as an interlayer insulator in multilayer high $T_c$ superconducting devices.

It is another object of this invention to provide epitaxial films of high $T_c$ copper oxide superconductors on substrates having good lattice matching and good electrical properties for device configurations.

It is another object of this invention to provide favorable substrates and interlayer insulators for perovskite high $T_c$ superconductors.

It is another object of this invention to provide improved perovskite superconductor-substrate combinations.

It is another object of this invention to provide superconducting perovskite-gallate combinations which can be used in superconducting electrical devices.

It is another object of this invention to provide highly oriented superconductive oxide films on gallate substrates.

It is another object of this invention to provide oxide superconductors-gallate substrate combinations which have substantially matched atomic spacings.

BRIEF DESCRIPTION OF THE INVENTION

This invention relates to an improved class of substrates and interface layers for high $T_c$ superconducting perovskite materials, such as the superconducting materials having Cu-O planes therein which are responsible for carrying supercurrents in these materials. Epitaxial films of these high $T_c$ superconductors can be deposited on gallate substrates, where the substrates are rare earth gallates or rare earth-like gallates. These superconductor-substrate combinations are particularly suited for analog and digital signal processing devices including matched filters, correlators, Fourier transformers, spectrum analyzers, samplers, A/D converters, etc.

In general, the gallate substrate materials can be grown by conventional techniques, such as the Czochralski method or the Bridgman method, and are cut to leave a wafer whose surface approximates the primitive cubic perovskite (001) plane. This provides excellent lattice matching to the copper and oxygen atoms in the Cu-O planes of copper oxide superconducting films. These gallate materials can also be deposited as films by evaporation and sputtering, for use as insulating interface layers, tunnel barriers, etc., in combination with high $T_c$ superconductors.

The high $T_c$ superconductors used with these gallate substrates are preferably those which include Cu-O and Cu-O like current carrying planes and can include rare earth and rare earth-like elements, as well as combinations of these elements. Also included are the non-rare earth high $T_c$ superconductors such as those having Bi-Sr-Ca-Cu-O compositions and Tl-Ba-Ca-Cu-O compositions. Gallates may also be used with non-copper containing oxide superconductors, although the degree of lattice matching may be less than that when copper containing oxide superconductors are used. Lattice matching of the superconductor atomic spacing to the Ga-O plane is especially good with the copper oxide superconductors which form unique combinations with these gallates.

These rare earth and rare earth-like gallate substrates can be prepared in high quality crystal form and provide excellent lattice matches to the Cu-O based superconducting perovskites. This is important in device applications since for oxide materials misfit strains are extremely critical. Additionally, these gallates can tolerate high temperatures if necessary for the best quality superconductor film growth and have relatively low dielectric constants and dielectric losses. Further, they can be grown to large sizes by standard crystal growth techniques. There appears to be very little interdiffusion from the substrates into the superconductor films so that the properties of the superconductors are not impaired even at high processing temperatures. Both the substrate materials and the superconductor films can be doped to modify their properties and/or lattice constants.

These and other objects, features, and advantages will be apparent from the following more particular description of the preferred embodiments.

DETAILED DESCRIPTION OF THE PREFERRED EMBODIMENTS

Figure 1:
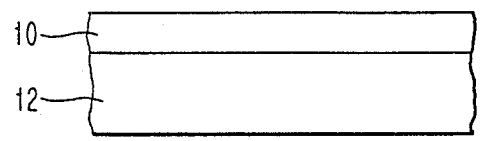
FIG. 1 illustrates a high $T_c$ superconducting film epitaxially deposited on a rare earth or rare earth-like gallate substrate.

FIG. 1 illustrates a high $T_c$ superconducting film-substrate combination in which a superconducting film 10 has been deposited on the crystal substrate 12. A cooling means, if needed, is not shown but is well known in the art.

Substrate 12 is a gallate substrate comprised of a rare earth or rare earth-like element, gallium, and oxygen.

Examples include LaGaO$_3$ and NdGaO$_3$. A mixed gallate can also be used, such as one prepared from La-Y solid solutions. This technique is used to provide different lattice constants and to introduce different properties in the substrate. The rare earth elements suitable for use in the substrate include elements 58-71 of the periodic table, and in particular, Ce, Pr, Nd, Sm, Eu, Gd, Tb, Dy, Ho, Er, Tm, Yb, and Lu. The rare earth-like elements suitable for use in the gallate substrates include Y, La, Bi and Sc. As noted, combinations of these rare earth and rare earth-like elements can also be used.

For the copper oxide superconductors the rare earth elements Tb, Dy, Ho, Er, Tm, Yb, and Lu may not provide atomic spacings that give lattice matches as favorable as those provided by gallates incorporating the rare earths Ce, Pr, Nd, Sm, Eu and Gd.

The high $T_c$ superconducting film 10 is one which in preferred form is characterized by Cu-O planes that are primarily responsible for carrying the supercurrents in these materials. They generally have a perovskite-related structure and can include rare earth and/or rare earth-like elements. These materials often include alkaline earth elements, as for example Ca, Ba, Sr, Mg, ... An example of a 92° K. superconductor is the well known YBa$_2$Cu$_3$O$_{7-x}$, which is the so-called "1-2-3" phase.

The superconducting film 10 can also be a copper oxide composition which does not include a rare earth element, but instead includes an element such as Bi. A representative example is one in the system Bi-Sr-Ca-Cu-O which exhibits a drop in electrical resistance at about 115° K. and a transition to zero resistance at 85° K. Recently, C. Michel and co-workers reported superconductivity in the non-rare earth containing Bi-Sr-Cu-O system. C. Michel et al., Z. Phys. B-Condensed Matter, 68, 412 (1987).

A new BiSrCaCuO$_x$ composition was then found by Maeda and Tanaka to exhibit high transition temperatures with a resistivity completion in the 80° K. range and a well defined resisitivity decrease at about 115° K. This work is published in the Japanese Journal of Physics, Vol. 27, p. L209 (1988). The work of Maeda, Tanaka et al. was confirmed by C. W. Chu and co-workers, and by Hazen and co-workers, these researchers noting the structure and phase identification of this bismuth —including copper oxide system. Reference is made to R. M. Hazen et al., Physical Review Letters, 60, p. 1174, (1988).

The new thallium-based superconductors can also be used for the superconducting film 10. These materials are usually in the 2-2-1-2 and/or 2-2-2-3 phases, these phases corresponding to the relative amounts of Tl-Ba-Ca-Cu-O. For a further discussion of these materials, reference is made to M. A. Subramanian et al., Nature, Vol. 332, p. 420, Mar. 31, 1988.

The substrate is prepared by well known crystal growth techniques including the Czochralski method, as well as Bridgman methods. The superconducting films can be prepared by many film deposition techniques including vapor transport (such as electron beam co-deposition), single or multiple target sputtering, and solution pyrolysis, using different solution precursors (such as nitrates). Generally, vacuum deposition techniques tend to produce films which are oxygen deficient. The films are annealed in an oxygen atmosphere in order to obtain the correct stoichiometry. The thallium and bismuth based superconductors may not require slow cooling in an oxygen atmosphere in order to incorporate the correct stoichiometric amounts of oxygen. Any of these techniques can be used to deposit epitaxial (oriented) films of the appropriate superconductors, using starting materials that are well known in the art. Prior to film deposition, the surface of the substrate is mechanically and chemically polished and/or annealed to provide a clean crystalline surface. These polishing techniques are also well known in the art and are applied to other substrate materials, such as silicon.

Figure 2:
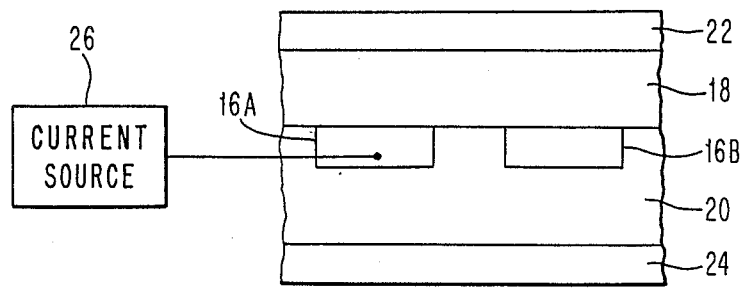
FIG. 2 illustrates a structure including a high $T_c$ superconducting strip line surrounded by a gallate lattice-matched insulator, and further including high $T_c$ superconducting ground planes in a structure suitable for electronic devices.

FIG. 2 shows a strip line structure of a type suitable for use in superconductive analog or digital signal processing devices. Devices of this type are described in, for example:

S. A. Reible et al., IEEE Trans. Mag., Vol. Mag—19, No. 3, p. 475, May, 1983.

R. S. Withers et al., Ibid, p. 480.

A. C. Anderson et al., Ibid, p. 485.

In this structure, a superconducting strip line is comprised of the patterned high $T_c$ superconducting lines 16A and 16B. These lines are surrounded by the gallate insulators 18 and 20, which in turn have high $T_c$ superconductors 22 and 24 in contact therewith. Superconductors 22 and 24 function as ground planes for the signal lines 16A and 16B, which are connected to the current source 26. To make this structure the top half (gallate layer 18 and superconductor 20) is pressed into contact with the bottom half (layers 16A, 16B, 20 and 24) and heated to provide the composite. Etching can be used to provide grooves for the later deposition of lines 16A, 16B.

The structure of FIG. 2 using superconducting strip lines and associated ground planes is a common structure of the type used in analog signal processing devices. In the present invention, the signal lines 16A and 16B can be patterned high $T_c$ oxide superconductors formed on a gallate substrate having low dielectric constant and low loss. Because of this, advantages result when the structure is operated at temperatures near to or in excess of 77° K., the temperature of liquid nitrogen. Of course, device structures can also be operated at temperatures less than 77° K.

Another device structure using gallates is a tunnel device or Josephson device where a thin gallate layer is evaporated or sputtered onto a high $T_c$ superconductor. The gallate layer can be very thin (on the order of 20-50 angstroms) and function as a tunnel barrier. Of course, gallate layers of greater thickness, such as those shown in FIG. 2, can be used as insulation layers in combination with high $T_c$ oxide superconductors.

TABLE I gives the lattice parameters for several rare earth gallates while TABLE II gives the lattice parameters of several high $T_c$ superconductors. Each of these TABLES is divided into separate columns which consider the orthorhombic cell parameters as well as the approximate equivalent primitive perovskite cell parameters. The notes below TABLE I describe how the parameters a, b, c, a$_0$, b$_0$, and c$_0$ are obtained. The Ga-Ga spacing in the a-b plane (normal to the c-axis) of the substrate is designated a$_c$. This spacing is to register with the Cu-Cu spacing in the associated plane of the overlying superconductor film.

The data for the lattice parameters in TABLES I and II are taken from publicly available references. The references used for the data of TABLE II include the following:

J. M. Tarascon et al., Phys. Rev. B 36, 226 (1987).

S. S. P. Parkin et al., submitted to Phys. Rev. Lett., Mar. 11, 1988.

M. A. Subramanian et al., Nature, Vol. 323, p. 420 (1988).
C. C. Torardi et al., Science, 240, p. 631, (1988).
R. M. Hazen et al., Phys. Rev. Lett., 60, p. 1174 (1988).
S. A. Sunshine et al., submitted to Phys. Rev. Lett., February, 1988.

TABLE I

Rare Earth Gallate Lattice Parameters

| | Orthorhombic cell parameters | | | Approximate equivalent Perovskite cell parameters | | | Ga-Ga spacing |
|---|---|---|---|---|---|---|---|
| | $a_0$ | $b_0$ | $c_0$ | a | b | c | $a_c$ |
| $LaGaO_3$ | 5.496 | 5.524 | 7.787 | 3.886 | 3.906 | 3.894 | 3.896 |
| $CeGaO_3$ | | | | 3.87 | 3.87 | 3.87 | 3.87 |
| $PrGaO_3$ | 5.465 | 5.495 | 7.729 | 3.864 | 3.886 | 3.865 | 3.875 |
| $NdGaO_3$ | 5.426 | 5.502 | 7.706 | 3.837 | 3.891 | 3.853 | 3.864 |
| $SmGaO_3$ | 5.369 | 5.520 | 7.650 | 3.796 | 3.903 | 3.825 | 3.850 |
| $EuGaO_3$ | 5.351 | 5.528 | 7.628 | 3.784 | 3.909 | 3.814 | 3.847 |
| $GdGaO_3$ | 5.322 | 5.537 | 7.606 | 3.763 | 3.915 | 3.803 | 3.840 |
| $(SrTiO_3$ | | | | 3.905 | 3.905 | 3.905) | |

Notes
$a_0$, $b_0$, and $c_0$ are the orthorhombic lattice parameters.
a and b are $a_0$ and $b_0$ divided by $\sqrt{2}$.
c is $c_0$ divided by 2.
$a_c$ is the Ga-Ga spacing in the ab plane which is to register with the Cu-Cu spacing in the ab plane of the superconductors.
The rare earth gallate data is taken from S. Geller, Acta Cryst. Vol. 10 (1957), pp. 243–251. "Crystallographic Studies of Perovskite-Like Compounds."

TABLE II

High Tc Superconductor Lattice Parameters

| Superconductor | $T_c$ | Approximate equivalent Orthorhombic cell parameters | | | Perovskite cell parameters | | |
|---|---|---|---|---|---|---|---|
| | | $a_0$ | $b_0$ | $c_0$ | a | b | c = $c_0$/n |
| $YBa_2Cu_3O_{7-x}$ | 92 K | | | 11.684 | 3.817 | 3.884 | |
| $YBa_2Cu_3O_{7-x}$ | 92 K | | | 11.657 | 3.8237 | 3.8874 | 3.886 |
| $LaBa_2Cu_3O_{7-x}$ | 92 K | | | 11.783 | 3.8562 | 3.9057 | 3.928 |
| $NdBa_2Cu_3O_{7-x}$ | 92 K | | | 11.736 | 3.8546 | 3.9142 | 3.912 |
| $SmBa_2Cu_3O_{7-x}$ | 92 K | | | 11.721 | 3.855 | 3.899 | 3.907 |
| $EuBa_2Cu_3O_{7-x}$ | 92 K | | | 11.704 | 3.8448 | 3.9007 | 3.901 |
| $GdBa_2Cu_3O_{7-x}$ | 92 K | | | 11.703 | 3.8397 | 3.8987 | 3.901 |
| $DyBa_2Cu_3O_{7-x}$ | 92 K | | | 11.668 | 3.8284 | 3.8888 | 3.889 |
| $HoBa_2Cu_3O_{7-x}$ | 92 K | | | 11.670 | 3.8221 | 3.8879 | 3.890 |
| $ErBa_2Cu_3O_{7-x}$ | 92 K | | | 11.659 | 3.8153 | 3.8847 | 3.886 |
| $TmBa_2Cu_3O_{7-x}$ | 92 K | | | 11.656 | 3.8101 | 3.8821 | 3.885 |
| $YbBa_2Cu_3O_{7-x}$ | 92 K | | | 11.650 | 3.7989 | 3.8727 | 3.883 |
| $LuBa_2Cu_3O_{7-x}$ | 92 K | | | not reported | | | |
| $Tl_2Ba_2Ca_1Cu_2O_x$ | ~118 K | | | 29.39 | 3.857 | 3.857 | |
| $Tl_2Ba_2Ca_1Cu_2O_x$ | ~118 K | | | 29.318 | 3.855 | 3.855 | |
| $Tl_2Ba_2Ca_2Cu_3O_x$ | 125 K | | | 36.23 | 3.821 | 3.821 | |
| $Tl_2Ba_2Ca_2Cu_3O_x$ | 125 K | | | 35.9 | 3.85 | 3.85 | |
| $Tl_1Ba_2Ca_2Cu_3O_x$ | ~110 K | | | 15.871 | 3.8429 | 3.8429 | |
| $Bi_2Sr_2Ca_1Cu_2O_x$ | ~85 K | | | 30.66 | 3.81 | 3.81 | |
| $Bi_2Sr_2Ca_1Cu_2O_x$ | ~85 K | 5.41 | 5.44 | 30.78 | 3.82 | 3.85 | |
| $Bi_2Sr_2Ca_1Cu_2O_x$ | ~85 K | | | 30.6 | 3.817 | 3.817 | |
| $Bi_2Sr_2Ca_1Cu_2O_x$ | ~85 K | 5.414 | 5.418 | 30.89 | 3.828 | 3.831 | |
| $Bi_2Sr_2Ca_2Cu_3O_x$? | ~110 K | | | 30.7 | 3.82 | 3.82 | |

Particularly good lattice matches can be found, for example, by matching the a-b plane of the superconductors $EuBa_2Cu_3O_{7-x}$ and $GdBa_2Cu_3O_{7-x}$ onto the a-b plane of a $NdGaO_3$ substrate. Certain cuts of the substrate $NdGaO_3$ also seem to be quite suitable for Tl-based superconductors.

Other cuts of rare earth gallate crystals in addition to cuts perpendicular to the c-axis also give good lattice matches to high $T_c$ superconductors having copper oxide planes. The important factor is to expose a surface of the substrate that approximates the square lattice of the Cu-O sheets in the high $T_c$ superconducting materials. For example, substrate cuts along rare earth orthorhombic 110 planes expose favorable surfaces. An example of this that is particularly favorable is a cut parallel to the 110 plane in $NdGaO_3$, which provides a good lattice match for both the 2-2-2-3 and the 2-2-1-2 phases of Tl-Ba-Ca-Cu-O superconductors.

It has been proven to be difficult to stabilize the approximately 110° K. superconducting phase of Bi-Sr-Ca-Cu-O superconductors. However, a favorable epitaxial substrate chosen from the class of gallates including a rare earth or rare earth-like element may aid in stabilizing this and other high $T_c$ phases. A cut along the [110] orthorhombic unit cell of $GdGaO_3$ would expose a surface with a favorable lattice match which may provide stabilization.

The use of these gallate substrates has not led to adverse diffusion of Ga into the epitaxial superconductors. Although some diffusion may exist at high temperatures, the properties of these epitaxial films are substantially similar to those of pure superconductor materials.

As noted previously, the substrate is chosen to give a good lattice match to the atoms of the epitaxial superconductor film. While it is customary to use substrates having a and b axes in the plane of the substrate, it will be appreciated by those of skill in the art that the b-c axes and the a-c axes can be in the plane of the substrate. As an example, an a-b cut of a boule of $NdGaO_3$ can be used as a substrate for a superconducting epitaxial film of Gd-Ba-Cu-O having a 1-2-3 phase. Another example, noted earlier, is an a-c cut in a boule of $NdGaO_3$ material to provide a suitable substrate for the Tl-based superconductors.

Figure 3:
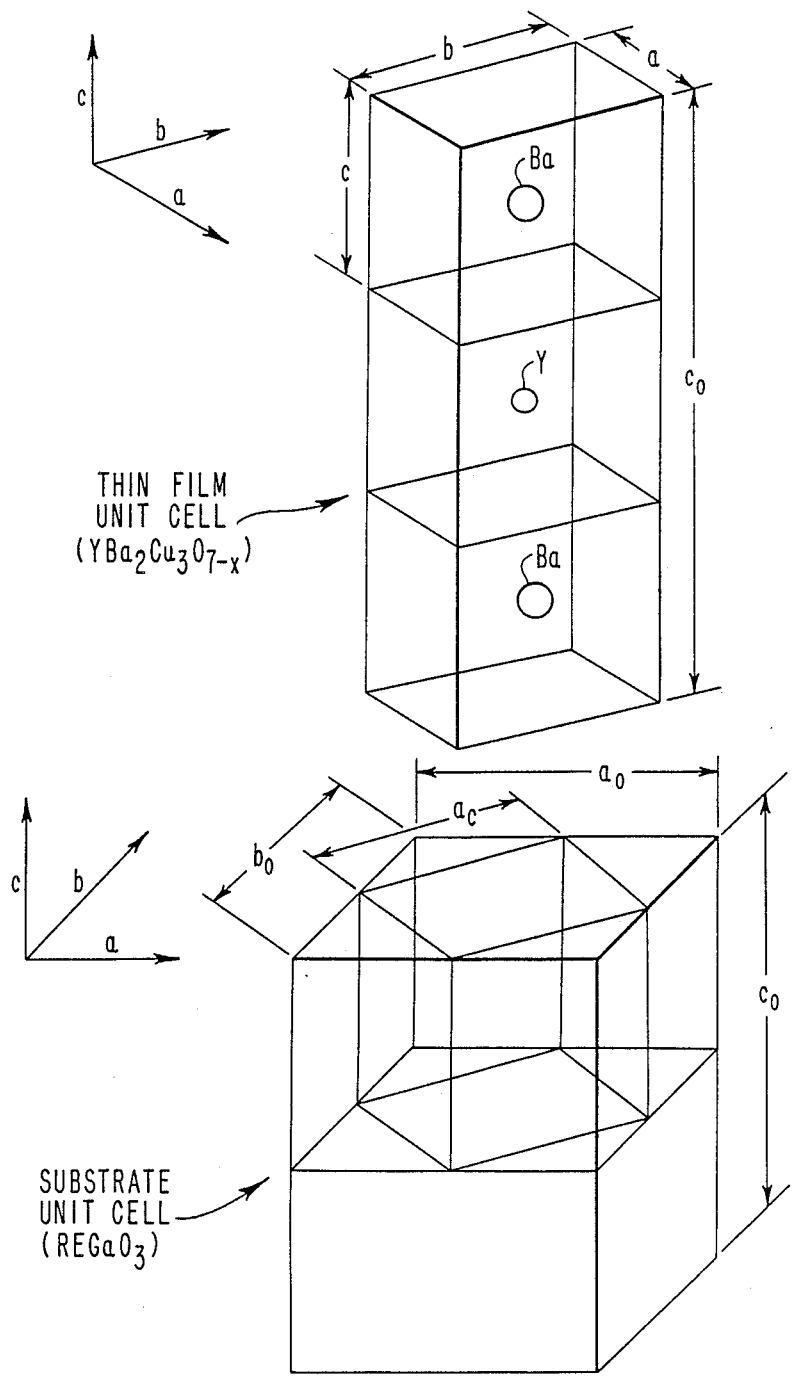
FIG. 3 illustrates the atomic arrangement of atoms in a rare earth gallate substrate and atoms in a Y-Ba-Cu-O deposited oriented superconductive film showing the relative arrangement of the atoms and the good lattice matches that result.

FIG. 3 illustrates the relative placement of the unit cell of a representative superconducting thin film on a rare earth gallium oxide substrate. In this example, the superconducting film is $YBa_2Cu_3O_{7-x}$ which is deposited on a perovskite-type rare earth (RE) gallate RE-$GaO_3$. For this epitaxial orientation, the unit cell of the superconducting thin film is rotated 45° with respect to the unit cell of the $REGaO_3$ substrate.

In FIG. 3, the crystallographic axes are shown, as well as the orthorhombic cell parameters $a_0$, $b_0$, and $c_0$. Also shown are the equivalent cubic perovskite parameters a, b, and c, as well as the Ga-Ga spacing $c_0$. These quantities all correspond to the like-labelled parameters in the foregoing tables.

While the unit cell of this superconducting thin film is rotated 45° with respect to the unit cell of the perovskite substrate, such rotation will not be needed for epitaxial matches of different superconductors to the rare earth and rare earth-like gallate substrates. One of skill in the art would use an orientation of the substrate such that good epitaxy and lattice matching will occur with the chosen superconducting film. In this example, the a and b axes are in the plane of the substrate while the c axis is normal to the substrate surface. However, some lattice matches may be enhanced for epitaxy if, for example, the b and c axes or the a and c axes were in-plane. Regardless of the conventional notation used to describe crystal systems, it is preferred to have an arrangement of the atoms on the substrate surface which approximates a (100) cubic perovskite surface. With this as a guide, the substrate boule material is cut to provide the desired orientation.

It has been noted that the gallate substrates including a rare earth element or a rare earth-like element exhibit good hardness and tolerance to high temperatures. However, it may be preferable to process the superconducting film at temperatures less than the rhombohedral-orthorhombic transition of the substrate in order to maintain the slight orthorhombicity of the substrate. For $LaGaO_3$, this temperature is about 875° C.

The classic perovskite crystallographic structure gives the atomic positions in a unit cell for $CaTiO_3$, a naturally occuring mineral, where Ca usually has twelve oxygen neighbors and Ti has six. All of the presently known superconducting copper oxide compounds contain perovskite-type cells as building blocks where Cu ions replace the Ti ions of the $CaTiO_3$ perovskite and Ca is replaced mainly by rare earths, Y, or Ba and Sr. $YBa_2Cu_3O_{7-x}$, in the 1-2-3 phase, has a basic unit cell as shown in FIG. 3, having two Ba cuprate perovskite cells that extend laterally into layers normal to the vertical c-axis, with a Y cuprate cell layer sandwiched between them. These three layers are repeated along the c axis to build a crystal. All of the superconducting cuprates known have perovskite blocks arranged in planes with continuous $CuO_2$ sheets that are the pathways of superconduction. In the 1-2-3 material illustrated in FIG. 3, it is the neighboring $CuO_2$ sheets between Y and Ba cuprate cells that support superconductivity.

Accordingly, to grow epitaxial films with desirable superconducting properties the c-axis is preferably normal to the substrate interface which should contain (001) oriented perovskite cell cation arrangements, or atomic arrays that the superconducting layer atoms will interpret as such. Another way of specifying this is to say that a good surface substrate layer has a simple perovskite plane containing the a and b axes.

The cuprate superconducting oxides contain a basic perovskite cell with a lattice constant of about 0.39 nm, so preferred substrates should contain a matching perovskite cell in their structure. The rare earth gallate perovskites, particularly the lighter rare earth gallates of La and Nd, satisfy this requirement. La is first in the rare earth series and Gd is in the middle. $La^{3+}$ ions are larger than $Gd^{3+}$ ions Gallates of the rare earth elements from La to Gd are potentially useful as superconducting oxide substrates. There is a tendency for the heavier rare earth gallates to be less stable in the perovskite phase for a 1:1 ratio of RE:Ga. For example, $GdGaO_3$ perovskite tends to decompose to other forms of the constituent oxides. However, special known annealing procedures can be used to stabilize gallates having these tendencies.

As an example, $YBa_2Cu_3O_x$ films were epitaxially deposited on chemically polished $LaGaO_3$ crystal wafers by Rf sputtering, electron beam evaporation, and trifluoroacetate hydrolysis, with subsequent annealing at temperatures less than 1150° K. These films are epitaxial with their c-axis normal to the growth interface. Film textures are influenced by the orthorhombic perovskite substrate. Films have been deposited having zero resistance at about 90° K. and high current densities in excess of $10kA/cm^2$ at 77° K. The substrate had a dielectric constant of 25 at room temperature and a low dielectric loss tangent of about 0.0001. The $LaGaO_3$ substrates were easier to polish than $SrTiO_3$, and were no more reactive with the superconducting films when high temperature annealing occurred at temperatures less than 1150° K. There was some evidence for Ga diffusion into the superconducting films; however, the $T_c$ values were very close to those observed for pure $YBa_2Cu_3O_{7-x}$.

In further examples, $YBa_2Cu_3O_{7-x}$ has been reproducibly grown on $LaGaO_3$ having [110] and [100] oriented (primitive perovskite cell) single crystal substrates. Three deposition techniques have been used.

The $LaGaO_3$ substrate has a distorted perovskite structure and can be described by considering layers of atoms parallel to the (001) planes. There are four such layers in the unit cell as schematically illustrated in FIG. 3. Two layers contain La and O, with the O ions located at the four corners and the center of the nearly square layer. The La ions are located between the corner O ions. The other two layers contain Ga and O, with the Ga ions at the four corners and the center of the layer. The O ions are located between Ga ions, on segments which connect the corner Ga ions to the center ion.

For these substrates, a $LaGaO_3$ single crystal boule was used that was grown to a size of 20 mm in diameter × 90 mm long in the [100] growth direction. Slices of this boule were cut along the [110], [100] and [010] primitive cell directions.

The $YBa_2Cu_3O_{7-x}$ superconducting films were deposited on these substrates by three techniques: single-target oxide RF magnetron sputtering, spin-on trifluoracetate (TFA) pyrolysis, and three pocket electron beam evaporation. For each deposition technique, smooth superconducting films were obtained having varying thicknesses depending upon the growth technique. For the sputtered films, the superconducting film thicknesses were 0.4–0.92 micrometers which were completely superconducting by 90.6° K. The critical current for these films at 5° K. is $5 \times 10^5 A/cm^2$.

The second technique utilized TFA solutions to make fluoride precursor films of $YBa_2Cu_3O_{7-x}$ that convert to the desired oxides when heated to about 1100° K. in helium/water and slow-cooled in oxygen. The product thin films were 1–3 micrometers thick and exhibited zero resistance at 90° K.

The superconducting films produced by the electron beam evaporation system were 0.8–1 micrometers thick and were annealed in helium and oxygen at 950° C. and slowly cooled in oxygen to room temperature. The $T_c$ was complete for these films by 87° K.

The single target sputtering technique is described in a paper by R. L. Sandstrom et al., submitted to Appl. Phys. Lett., 1988. The spin-on pyrolysis technique is described by A. Gupta et al., in Appl. Phys. Lett. 52, 163 (1988). The three pocket electron beam system is described by R. B. Laibowitz et al., in Phys. Rev. B35, 8821 (1987), as well as in Phys. Rev. Lett. 58, 2684 (1987).

In the practice of this invention, highly oriented films of high $T_c$ oxide superconductors have been deposited on gallate substrates. These substrates are those which include at least one rare earth element or rare earth-like element. The superconducting epitaxial films are highly oriented and can approximate single crystals.

In the further practice of this invention, these high $T_c$ oxide superconducting film-gallate substrate combinations are particularly suitable for use in electronic devices including analog signal processors, digital devices, A/D converters, samplers, and Josephson devices.

It has also been found that these gallate substrates are harder than commonly used $SrTiO_3$ substrates and are easier to mechanically and chemically polish. Additionally, their thermal expansion coefficients match well to the oxide high $T_c$ superconductors.

While the invention has been described with respect to particular embodiments thereof, it will be apparent to those of skill in the art that variations can be made therein without departing from the spirit and scope of the present invention. For example, the gallate substrate materials may include combinations of rare earth elements and rare earth-like elements, and may also be doped to slightly vary lattice parameters. Further, the superconductive films deposited on these substrates, while preferably being copper oxide-based superconductors, can include rare earth elements, rare earth-like elements, and alkaline earth elements. Still further, combinations of these elements may be present and, also, rare earth elements need not be present in the superconducting film.

The best epitaxial matches occur when the superconducting film is a copper oxide based film where the Cu-Cu spacing is substantially matched to the Ga-Ga spacing in the substrate. These Cu oxide superconductor-gallate combinations have special advantages based on these good lattice matches and are considered unique combinations that are suitable for device configurations of many types. Highly oriented superconductive layers are formed on these gallates and can be epitaxial with the gallates. While it is preferable to have single crystal gallates and superconductive films, it will be appreciated by those of skill in the art that the invention encompasses the use of these gallate layers in combination with oxide and copper oxide based superconductive films, and is not limited to either single crystal or epitaxial superconductive film-gallate combinations.

We claim:

1. A superconductive combination, including:
   a crystalline gallate layer, including a rare earth element or another element selected from the group consisting of Y, La, Bi, and Sc, or combinations of a rare earth element and at least one of said another elements.
   a superconductive layer thereon, said superconductive layer having a transistion temperature in excess of 77° K. and being an oxide material having Cu-O planes whose Cu and O atoms align with Ga and O atoms in said gallate layer.

2. The combination of claim 1, where said superconductive layer includes a rare earth element or an element selected from the group consisting of Y, La, Bi, Tl and Sc.

3. The combination of claim 1, where said superconductive layer includes an alkaline earth element.

4. The combination of claim 1, where said superconductive layer includes Bi.

5. The combination of claim 1, where said superconductive layer includes Tl.

6. The combination of claim 1, where said superconductive layer has a 1-2-3 superconducting phase.

7. The combination of claim 1, where said superconductive layer has an orthorhombic structure with its a and b axes in the plane of said layer.

8. The combination of claim 1, where said superconductive layer and said gallate layer have similar structures.

9. A superconductor-substrate combination comprising:
   a crystalline gallate substrate including a rare earth or another element selected from the group consisting of Y, La, Bi and Sc, and
   a superconductor layer in contact with said substrate, said superconductor layer being a high T copper oxide composition having lattice matching with said substrate.

10. The combination of claim 9, where said superconductor layer and said substrate have similar structures.

11. The combination of claim 9, where said superconductor layer and said substrate exhibit orthorhombicity.

12. The combination of claim 9, where said superconductor layer and said substrate are single crystals.

13. The combination of claim 9, where the arrangement of atoms on the surface of said substrate contacting said superconductor layer approximates a (100) cubic perovskite.

14. The combination of claim 9, where the unit cell of said superconductor layer is rotated approximately 45° with respect to the unit cell of said substrate.

15. A superconductive electrical device, including:
   a gallate layer including at least one rare earth element or another element selected from the group consisting of Y, La, Bi and Sc,
   a superconductor layer in contact with said gallate layer, said superconductor layer being comprised of an oxide material having a transition temperature in excess of 30° K., said superconductor layer being capable of carrying an electrical supercurrent, and
   an electrical source connected to said superconductor layer for providing electrical supercurrents in said superconductor layer.

16. The device of claim 15, where said gallate layer is a rare earth gallate.

17. The device of claim 16, further including a superconducting ground plane electrically isolated from said superconductor layer, said ground plane being comprises of a high $T_c$ oxide superconductor.

18. A superconductor structure, comprising:
   a rare earth gallate substrate, and
   an oriented layer of high $T_c$ superconductor on said substrate, said superconductor being comprised of Cu-O planes where the Cu-Cu spacing in said superconductor approximates the Ga-Ga spacing in said substrate.

19. The structure of claim 18, where said substrate has an orthorhombic crystal structure.

20. The structure of claim 18, where said substrate has a perovskite structure.

21. A superconductor-gallate combination, including:
a gallate layer containing a rare earth element or another element selected from the group consisting of Y, La, Bi and Sc,
a high $T_c$ superconductive oxide layer in contact with said gallate layer, said superconductive layer having atomic spacings which match the atomic spacings of said gallate layer at the interface of said gallate layer and said superconductive layer.

22. The combination of claim 21, where said superconductive layer is a copper oxide high $T_c$ material.

23. The combination of claim 21, where said superconductive layer is epitaxial with said gallate layer.

24. The combination of claim 21, further including a second high $T_c$ oxide superconductive layer, said gallate layer being located between said superconductive layers.

25. The combination of claim 24, where said gallate layer is sufficiently thin to have tunneling therethrough.

26. The combination of claim 25, where said high $T_c$ oxide superconductive layers contain copper.

27. The combination of claim 26, where said superconductive layers are oriented with respect to said gallate layer.

28. A superconductive structure comprising:
a gallate layer including at least one rare earth element or another element selected from the group consisting of Y, La, Bi and Sc,
a superconductive layer in contact with said gallate layer, said superconductive layer being comprised of an oxide material having a transition temperature in excess of 30° K.

29. The structure of claim 28, where said superconductive layer is a copper oxide.

* * * * *